United States Patent
Yan et al.

(10) Patent No.: US 12,379,643 B2
(45) Date of Patent: Aug. 5, 2025

(54) LENS DRIVE DEVICE

(71) Applicant: Changzhou AAC Raytech Optronics Co., Ltd., Changzhou (CN)

(72) Inventors: Feng Yan, Shenzhen (CN); Suohe Wei, Shenzhen (CN)

(73) Assignee: Changzhou AAC Raytech Optronics Co., Ltd., Changzhou (CN)

( * ) Notice: Subject to any disclaimer, the term of this patent is extended or adjusted under 35 U.S.C. 154(b) by 571 days.

(21) Appl. No.: 17/835,947

(22) Filed: Jun. 8, 2022

(65) Prior Publication Data

US 2023/0236475 A1 Jul. 27, 2023

(30) Foreign Application Priority Data

Jan. 27, 2022 (CN) .......................... 202210101575.7

(51) Int. Cl.
*G03B 5/00* (2021.01)
*G03B 17/12* (2021.01)
*H05K 1/18* (2006.01)

(52) U.S. Cl.
CPC ............... *G03B 5/00* (2013.01); *G03B 17/12* (2013.01); *H05K 1/18* (2013.01); *G03B 2205/0007* (2013.01); *G03B 2205/0069* (2013.01); *H05K 2201/10121* (2013.01)

(58) Field of Classification Search
CPC .. G03B 5/00; G03B 17/12; G03B 2205/0007; G03B 2205/0069; G03B 3/10; G03B 30/00; H05K 1/18; H05K 2201/10121; G02B 7/09; G02B 7/02
See application file for complete search history.

(56) References Cited

U.S. PATENT DOCUMENTS

| | | | |
|---|---|---|---|
| 2019/0025540 A1* | 1/2019 | Shin | G03B 3/12 |
| 2020/0033553 A1* | 1/2020 | Huang | G02B 7/08 |

\* cited by examiner

*Primary Examiner* — Charles S Chang
(74) *Attorney, Agent, or Firm* — Wiersch Law Group (57) ABSTRACT

The lens drive device provided according to the present disclosure includes a lens having an optical axis, a lens holder supporting the lens, an image stabilization frame, a base, and a drive component. The lens holder is elastically supported inside the image stabilization frame by a first elastic sheet, and the image stabilization frame is elastically supported on the base in the direction along the optical axis by a suspension component, where the suspension component includes a second elastic sheet and a suspension wire. The second elastic sheet includes a fixing portion and a suspension portion, and the suspension portion can be elastically deformed in the direction along the optical axis to buffer impact acted on the suspension wire. The lens drive device provided according to the present disclosure buffers the impact acted on the suspension wire by the suspension portion, so that the structural stability is provided.

18 Claims, 7 Drawing Sheets

LENS DRIVE DEVICE

TECHNICAL FIELD

The present disclosure relates to a drive device, in particular to a lens drive device applied to a portable electronic product.

BACKGROUND

With the development of imaging technology, a lens drive device is widely applied in various imaging devices. In addition to a portable camera, a portable terminal such as a smartphone and a tablet computer, is also equipped with high-performance lens drive devices. A high-performance lens drive device configured on the portable terminal generally has an autofocusing (AF) function and an optical image stabilization (OIS) function, where the OIS function can reduce photo shake caused by external shocks or hand tremor of a user.

The lens drive device provided in the conventional art includes a base, a bracket supported on the base by a suspension wire, and a lens component arranged in the bracket. The bracket is supported on the base by the suspension wire, so that the bracket can move in a plane perpendicular to an optical axis to drive the lens component to move, so as to achieve the optical image stabilization. However, when the lens drive device is impacted by an external force, the bracket and the base move violently relative to each other, thereby causing the suspension wire connected between the bracket and the base to break, thereby causing the lens drive device to fail.

In addition, the bracket in the lens drive device provided in the conventional art is usually made of plastic material, so the bracket may crack or even break due to insufficient structural strength.

Therefore, it is necessary to provide an improved lens drive device to solve the above problems.

SUMMARY

Based on the above problems, a lens drive device is provided according to the present disclosure.

Specifically, solutions proposed by the present disclosure are as follows.

A lens drive device includes:

a lens having an optical axis, a lens holder supporting the lens, an image stabilization frame elastically supporting the lens holder in a direction perpendicular to the optical axis, a base elastically supporting the image stabilization frame in a direction along the optical axis, and a drive component configured to drive the lens. The lens holder is elastically supported inside the image stabilization frame by a first elastic sheet, and the image stabilization frame is elastically supported on a side of the base in the direction along the optical axis by a suspension component, where the suspension component includes a second elastic sheet fixed on the image stabilization bracket and a suspension wire elastically supported from the second elastic sheet to the base, the second elastic sheet includes a fixing portion embedded in the image stabilization bracket and a suspension portion extending from the fixing portion and connected to the suspension wire, and the suspension portion can be elastically deformed in the direction along the optical axis to buffer impact acted on the suspension wire.

As an improvement, the image stabilization bracket includes a plurality of side walls arranged oppositely, and a corner wall connecting two adjacent side walls of the plurality of side walls; the fixing portion is embedded in and fixed on each of the plurality of side walls, and the suspension portion is mounted on a side of the corner wall away from the base.

As an improvement, the drive component includes a first coil wound on the lens holder, a magnetic steel spaced from the first coil in the direction perpendicular to the optical axis, and a second coil arranged on the base and spaced from the magnetic steel in the direction along the optical axis; the magnetic steel is fixed on each of the plurality of side walls of the image stabilization bracket, and the fixing portion of the second coil is embedded in and fixed on a side of the magnetic steel away from the lens holder.

As an improvement, the fixing portion is made of magnetically conductive material.

As an improvement, the first elastic sheet is connected between the lens holder and the corner wall of the image stabilization bracket, and the first coil is electrically connected to the base by the first elastic sheet, the suspension portion and the suspension wire.

As an improvement, a conductive terminal configured to be electrically connected to an external circuit is embedded in the base, and the suspension wire is electrically connected to the conductive terminal to supply power to the first coil.

As an improvement, the corner wall includes a mounting portion arranged on a side of the corner wall away from the base, and a mounting column penetrating through both the first elastic sheet and the second elastic sheet protrudes from the mounting portion.

As an improvement, a protruding portion is arranged on the corner wall in the direction perpendicular to the optical axis, the protruding portion is spaced from the suspension portion in the direction along the optical axis, a damping glue groove penetrating through the protruding portion is defined on the protruding portion in the direction along the optical axis, the suspension wire passes through the damping glue groove, and damping glue is applied to the damping glue groove and covers the suspension wire.

As an improvement, the second elastic sheet includes two sheets arranged separately, and the second elastic sheet includes two first fixing portions respectively embedded in two of the side walls arranged oppositely, two of the suspension portions respectively connected to the two first fixing portions, and a second fixing portion connecting the two suspension portions and embedded in the two side walls.

As an improvement, the suspension portion and the fixing portion in any one of the above are integrally or separately arranged.

The structure of the lens drive device of the present disclosure includes a lens with an optical axis, a lens holder supporting the lens, an image stabilization frame elastically supporting the lens holder in a direction perpendicular to the optical axis, a base elastically supporting the image stabilization frame in a direction along the optical axis, and a drive component configured to drive the lens. The lens holder is elastically supported inside the image stabilization frame by a first elastic sheet, and the image stabilization frame is elastically supported on a side of the base in the direction along the optical axis by a suspension component. The suspension component includes a second elastic sheet fixed on the image stabilization bracket and a suspension wire elastically supported from the second elastic sheet to the base, the second elastic sheet includes a fixing portion embedded in the image stabilization bracket and a suspension portion extending from the fixing portion and connected to the suspension wire, and the suspension portion can be elastically deformed in the direction along the optical axis to buffer impact on the suspension wire. The lens drive device provided according to the present disclosure provides buffering for the suspension wire by the suspension portion of the second elastic sheet when the suspension wire is subjected to an impact force, which avoids a bad situation that the suspension wire breaks under extreme conditions (e.g., dropping), and improves the structural stability. Further, the second elastic sheet further includes a fixing portion embedded in the bracket, thereby enhancing the structural strength of the bracket and preventing the bracket from cracking and breaking.

DETAILED DESCRIPTION

The technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all of the embodiments. Based on the embodiments of the present disclosure, all other embodiments obtained without creative efforts by those of ordinary skill in the art shall fall within the protection scope of the present disclosure.

Figure 6:
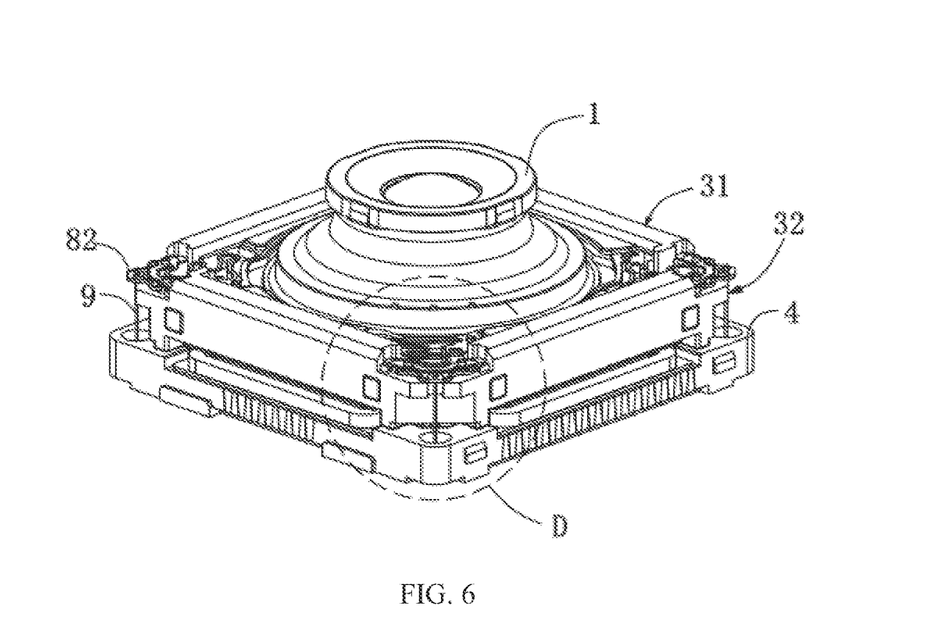
FIG. 6 is a partial three-dimensional structural view of a lens drive device in the present disclosure.
Figure 7:
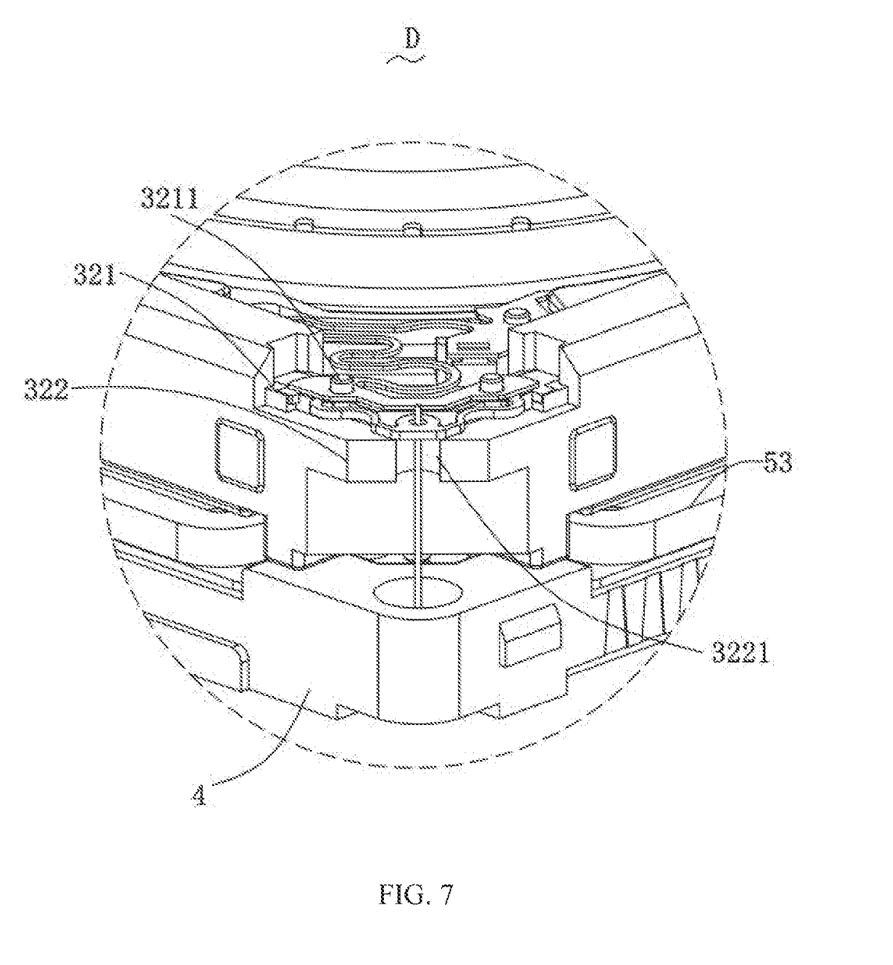
FIG. 7 is an enlarged view of part D in FIG. 3.

FIG. 1 to FIG. 9 show a lens drive device 100 provided according to the present disclosure. The lens drive device 100 provided according to the present disclosure includes a casing 11, a lens 1 having an optical axis O-O', and a lens holder 2 supporting the lens 1, an image stabilization frame 3 elastically supporting the lens holder 2 in a direction perpendicular to the optical axis O-O', a base 4 elastically supporting the image stabilization frame 3 in a direction along the optical axis O-O', and a drive component 5 configured to drive the lens 1 to move. The casing 11 and the base 4 jointly form an accommodating space. The image stabilization bracket 3 includes multiple side walls 31 arranged oppositely, and a corner wall 32 connecting two adjacent side walls 31 of the plurality of side walls 31. The lens holder 2 is elastically supported inside the image stabilization frame 3 by the first elastic sheet 6, the first elastic sheet 6 is connected between the lens holder 2 and the corner wall 32. The image stabilization frame 3 is elastically supported on a side of the base 4 in the direction along the optical axis O-O' by the suspension component 7, the suspension component 7 is arranged between the corner wall 32 and the base 4. The corner wall 32 includes a mounting portion 321 arranged on a side of the corner wall 32 away from the base 4 and a protruding portion 322 protruding in the direction perpendicular to the optical axis O-O'. The mounting portion 321 and the protruding portion 322 are spaced in the direction along the optical axis O-O', a damping glue groove 3221 penetrating through the protruding portion 322 is defined on the protruding portion 322 in the direction along the optical axis, and a mounting column 3211 penetrating through both the first elastic sheet 6 and the second elastic sheet 7 protrudes from the mounting portion 321, which in this way facilitates the electrical connection between the first elastic sheet 6 and the suspension component 7. As shown in FIG. 6 to FIG. 7, the first elastic sheet 6 is separately stacked on the suspension component 7, and a thickness of the first elastic sheet 6 is designed to not affect the position of the suspension component 7 in the direction along the optical axis O-O'. Therefore, the first elastic sheet 6 provided according to the present disclosure is more convenient to design and use a material with a larger thickness and a higher strength, so that a larger and heavier lens can be elastically suspended.

Figure 1:
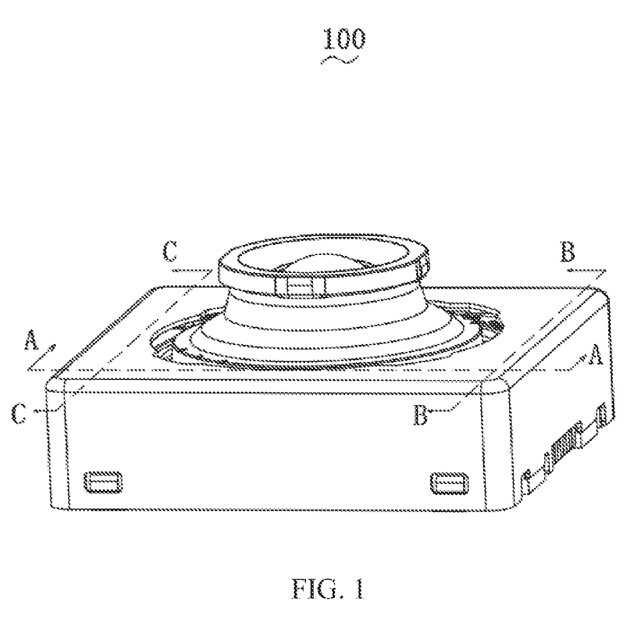
FIG. 1 is a three-dimensional structural view of a lens drive device in the present disclosure.
Figure 2:
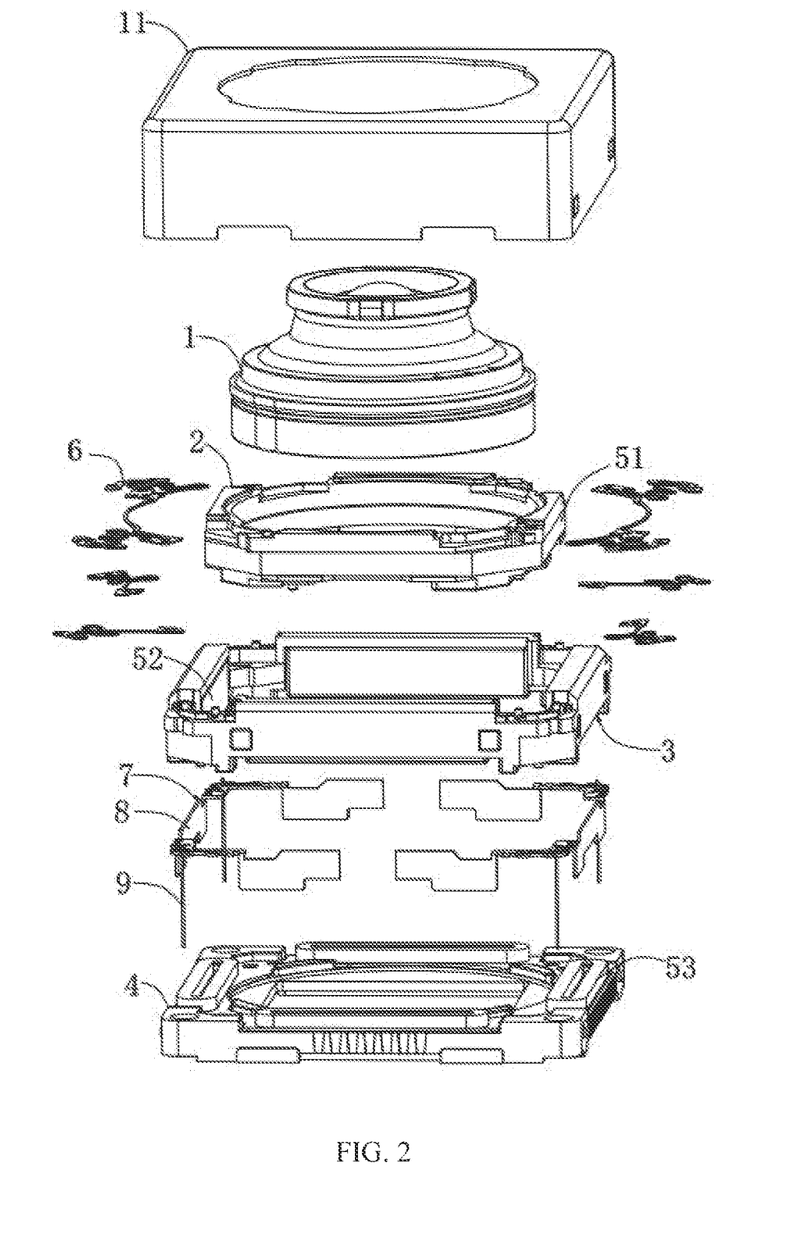
FIG. 2 is an explosive structural view of a lens drive device in the present disclosure.
Figure 3:
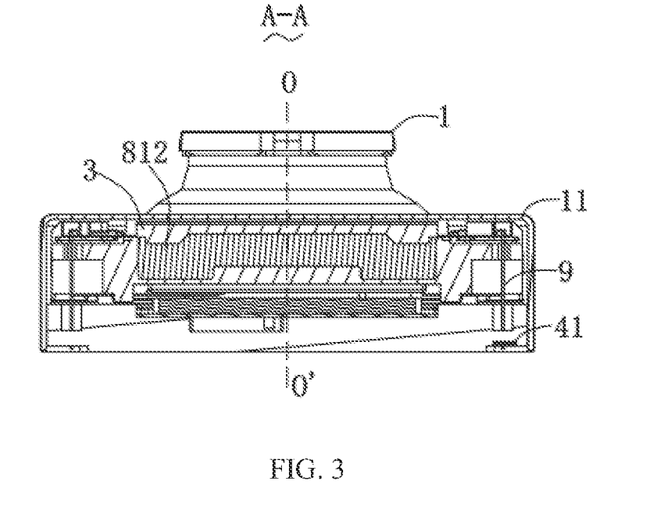
FIG. 3 is a cross-sectional view along line A-A in FIG. 1.
Figure 4:
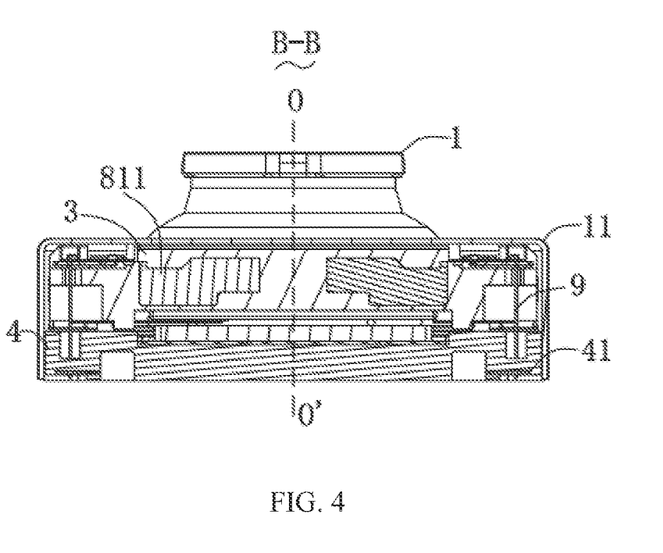
FIG. 4 is a cross-sectional view along line B-B in FIG. 1.
Figure 5:
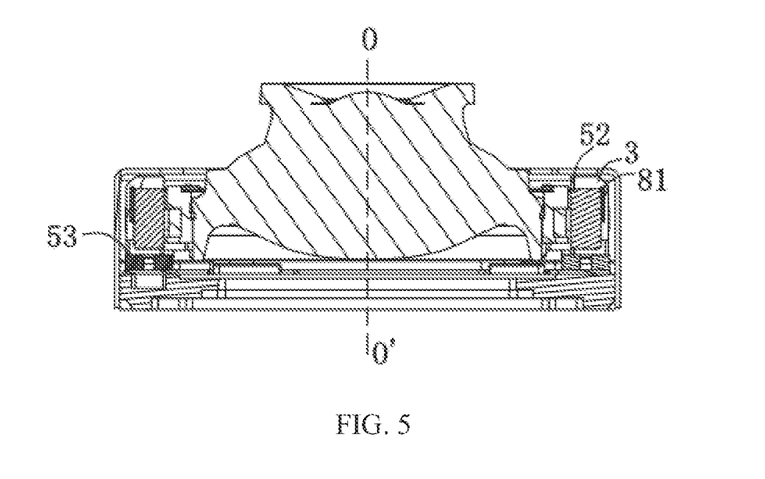
FIG. 5 is a cross-sectional view along line C-C in FIG. 1.

As shown in FIG. 2 to FIG. 4, the drive component 5 includes a first coil 51 wound on the lens holder 2, a magnetic steel 52 relatively spaced from the first coil 51 in the direction perpendicular to the optical axis O-O', and a second coil 53 arranged on the base 4 and spaced from the magnetic steel 52 in the direction along the optical axis O-O'. The magnetic steel 52 is fixed on the image stabilization bracket 3. The first coil 51 interacts with the magnetic steel 52 fixed on the image stabilization bracket 3 to drive the lens holder 2 to drive the lens 1 to move along the optical axis O-O', so as to achieve the autofocusing. At the same time, the first elastic sheet 6 can provide elastic reset for this process. The magnetic steel 52 acts with the second coil 53 fixed on the base 4 to drive the image stabilization bracket 3 to move in the direction perpendicular to the optical axis O-O'. The image stabilization bracket 3 can drive the lens 1 to move synchronously in the direction perpendicular to the optical axis O-O' to realize the autofocusing.

As shown in FIG. 4 to FIG. 8, the suspension component 7 includes a second elastic sheet 8 fixed on the image stabilization bracket 3, and a suspension wire 9 elastically supported on the base 4 from the second elastic sheet 8. The suspension wire 9 passes through the damping glue groove 3221, and the damping glue groove 3221 is provided with damping glue (not shown in the figure) warping the suspension wire 9. The damping glue wrapping the suspension wire 9 is in contact with the image stabilization bracket 3 at the same time. With this arrangement, resonance of the lens drive device 100 provided according to the present disclosure caused by the movement to achieve the autofocusing and optical image stabilization is suppressed, so that the imaging effect of the lens drive device 100 is improved.

As shown in FIG. 2 to FIG. 3, the second elastic sheet 8 includes a fixing portion 81 embedded in the side wall 31 and a suspension portion 82 extending from the fixing portion 81 and connected to the suspension wire 9. The fixing portion 81 can be used as an internal structural reinforcing piece of the image stabilization bracket 3 to improve the structural strength of the image stabilization bracket 3, thereby preventing the image stabilization bracket 3 from cracking or even breaking due to insufficient structural strength. The fixing portion 81 is embodied as magnetically permeable metal material and is embedded in and fixed on a side of the magnetic steel 52 away from the lens holder 2. With this arrangement, on the one hand, the bonding strength between the magnetic steel 52 and the image stabilization bracket 3 is enhanced; on the other hand, the fixing portion 81 can be served as a magnetic yoke to enhance the magnetic field strength between the magnetic steel 52 and the first coil 51. The suspension portion 82 is mounted on the mounting portion 321 of the corner wall 32 and is spaced from the protruding portion 322, and the suspension portion 82 can elastically deform in the direction along the optical axis O-O' to buffer the impact force acted on the suspension wire 9. With this arrangement, the lens drive module 100 provided according to the present disclosure provides buffering for the suspension wire 9 by the suspension portion 82 of the second elastic sheet 8 when the suspension wire 9 is subjected to an impact force, which avoids a bad situation that the suspension wire 9 breaks under extreme conditions (e.g., dropping), and improves the structural stability.

The first elastic sheet 6 is connected between the lens holder 2 and the image stabilization bracket 3, and the first coil 51 is electrically connected to the conductive terminal 41 embedded in the base 4 by the first elastic sheet 6, the suspension portion 82, and the suspension wire 9, so as to supply power to the first coil 51.

Figure 8:
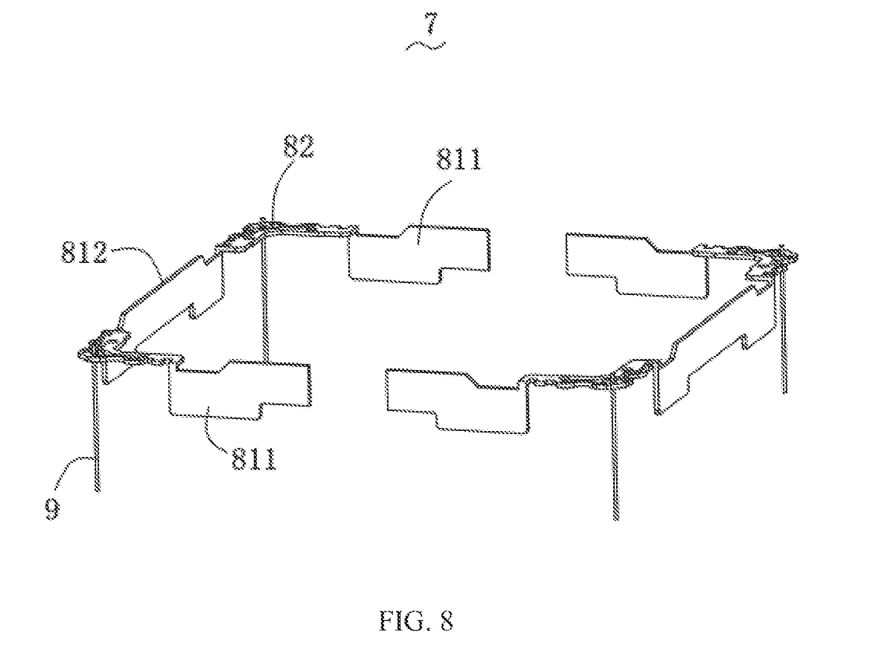
FIG. 8 is a three-dimensional structural view of a suspension component of a lens drive device in the present disclosure.

As shown in FIG. 8, the second elastic sheet 8 include two separate sheets, and the second elastic sheet 8 include two first fixing portions 811 respectively embedded in two of the side walls 31 arranged oppositely, two of the suspension portions 82 respectively connected to the two first fixing portions 811, and a second fixing portion 812 connecting the two suspension portions 82 and embedded in the two side walls 31. With this arrangement, electrical connection between the two adjacent suspension portions 82 is facilitated.

Figure 9:
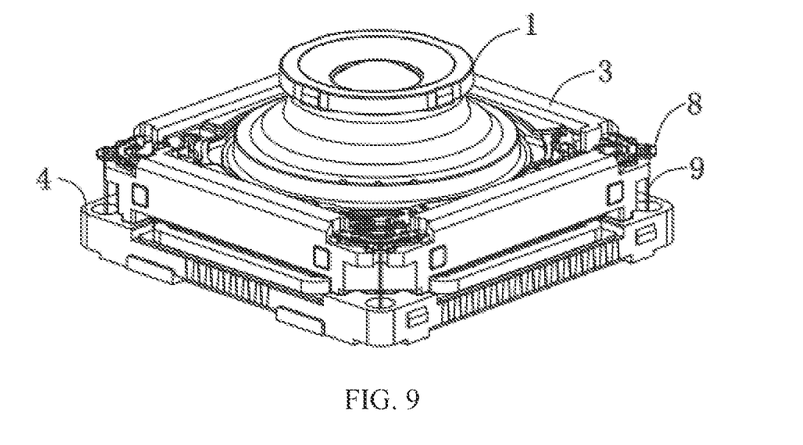
FIG. 9 is a partial three-dimensional structural view of a lens drive device in another embodiment of the present disclosure.
Figure 10:
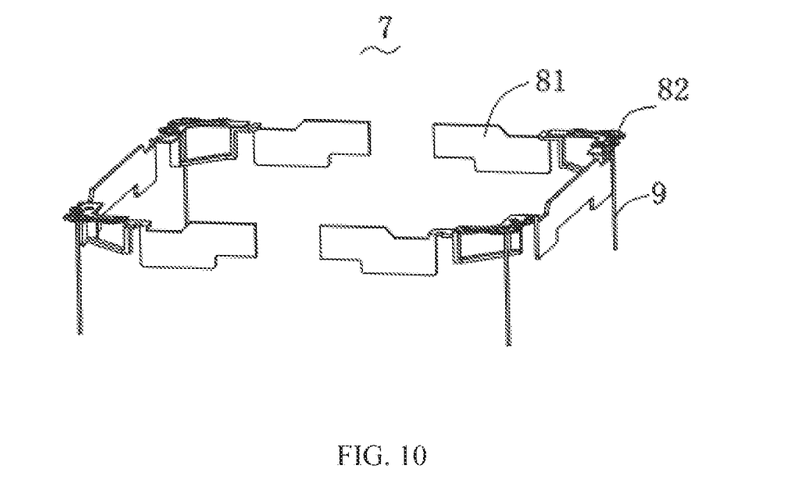
FIG. 10 is a three-dimensional structural view of a suspension component of a lens drive device in another embodiment of the present disclosure.

As shown in FIG. 9 to FIG. 10, the lens drive device 100 of another embodiment provided according to the present disclosure is different from the lens drive device 100 in the above embodiment only in that the suspension portion 82 and the fixing portion 81 of the second elastic sheet 8 are separately arranged.

The above are only the embodiments of the present disclosure. It should be pointed out that for those of ordinary skill in the art, improvements may be made without departing from the inventive concept of the present disclosure, and the improvements shall fall with the scope of protection of the present disclosure.

The invention claimed is:

1. A lens drive device, comprising a lens having an optical axis, a lens holder supporting the lens, an image stabilization frame elastically supporting the lens holder in a direction perpendicular to the optical axis, a base elastically supporting the image stabilization frame in a direction along the optical axis, and a drive component configured to drive the lens; the lens holder is elastically supported inside the image stabilization frame by a first elastic sheet, and the image stabilization frame is elastically supported on a side of the base in the direction along the optical axis by a suspension component, wherein the suspension component includes a second elastic sheet fixed on the image stabilization bracket and a suspension wire elastically supported from the second elastic sheet to the base, the second elastic sheet comprises a fixing portion embedded in the image stabilization bracket and a suspension portion extending from the fixing portion and connected to the suspension wire, and the suspension portion can be elastically deformed in the direction along the optical axis to buffer impact acted on the suspension wire;

wherein the image stabilization bracket comprises a plurality of side walls arranged oppositely, and a corner wall connecting two adjacent side walls of the plurality of side walls, the fixing portion is embedded in and fixed on each of the plurality of side walls, and the suspension portion is mounted on a side of the corner wall away from the base;

wherein the second elastic sheet comprises two sheets arranged separately, and the second elastic sheet comprises two first fixing portions respectively embedded in two of the side walls arranged oppositely, two of the suspension portions respectively connected to the two first fixing portions, and a second fixing portion connecting the two suspension portions and embedded in the two side walls.

2. The lens drive device according to claim 1, wherein the drive component comprises a first coil wound on the lens holder, a magnetic steel spaced from the first coil in the direction perpendicular to the optical axis, and a second coil arranged on the base and spaced from the magnetic steel in the direction along the optical axis; the magnetic steel is fixed on each of the plurality of side walls of the image stabilization bracket, and the fixing portion of the second coil is embedded in and fixed on a side of the magnetic steel away from the lens holder.

3. The lens drive device according to claim 2, wherein the fixing portion is made of magnetically conductive material.

4. The lens drive device according to claim 3, wherein the suspension portion and the fixing portion are integrally or separately arranged.

5. The lens drive device according to claim 2, wherein the first elastic sheet is connected between the lens holder and the corner wall of the image stabilization bracket, and the first coil is electrically connected to the base by the first elastic sheet, the suspension portion and the suspension wire.

6. The lens drive device according to claim 5, wherein a conductive terminal configured to be electrically connected to an external circuit is embedded in the base, and the suspension wire is electrically connected to the conductive terminal to supply power to the first coil.

7. The lens drive device according to claim 5, wherein the suspension portion and the fixing portion are integrally or separately arranged.

8. The lens drive device according to claim 6, wherein the suspension portion and the fixing portion are integrally or separately arranged.

9. The lens drive device according to claim 2, wherein the suspension portion and the fixing portion are integrally or separately arranged.

10. The lens drive device according to claim 2, wherein the first coil is configured to interact with the magnetic steel fixed on the image stabilization bracket to move in the direction along the optical axis, and the image stabilization bracket is configured to drive the lens to realize autofocusing.

11. The lens drive device according to claim 2, wherein the magnetic steel is configured to act with the second coil fixed on the base to drive the image stabilization bracket to move in the direction perpendicular to the optical axis, and the image stabilization bracket is configured to drive the lens to move synchronously in the direction perpendicular to the optical axis to realize autofocusing.

12. The lens drive device according to claim 1, wherein the corner wall comprises a mounting portion arranged on a side of the corner wall away from the base, and a mounting column penetrating through both the first elastic sheet and the second elastic sheet protrudes from the mounting portion.

13. The lens drive device according to claim 12, wherein a protruding portion is arranged on the corner wall in the direction perpendicular to the optical axis, the protruding portion is spaced from the suspension portion in the direction along the optical axis, a damping glue groove penetrating through the protruding portion is defined on the protruding portion in the direction along the optical axis, the suspension wire passes through the damping glue groove, and damping glue is applied to the damping glue groove and covers the suspension wire.

14. The lens drive device according to claim 13, wherein the suspension portion and the fixing portion are integrally or separately arranged.

15. The lens drive device according to claim 12, wherein the suspension portion and the fixing portion are integrally or separately arranged.

16. The lens drive device according to claim 1, wherein the suspension portion and the fixing portion are integrally or separately arranged.

17. The lens drive device according to claim 1, wherein the suspension portion and the fixing portion are integrally or separately arranged.

18. The lens drive device according to claim 1, wherein the suspension portion and the fixing portion are integrally or separately arranged.

\* \* \* \* \*